United States Patent
Balamurugan et al.

(12)

(10) Patent No.: US 6,320,795 B1
(45) Date of Patent: Nov. 20, 2001

(54) PSEUDO-STATIC LEAKAGE-TOLERANT REGISTER FILE BIT-CELL CIRCUIT

(75) Inventors: Ganesh Balamurugan, Urbana, IL (US); Ram K. Krishnamurthy, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/733,225

(22) Filed: Dec. 8, 2000

(51) Int. Cl.⁷ ...................................................... G11C 7/00
(52) U.S. Cl. ................................ 365/189.08; 365/189.08; 365/230.05
(58) Field of Search ........................ 365/189.05, 189.08, 365/189.12, 230.05

(56) References Cited

U.S. PATENT DOCUMENTS 5,481,495 * 1/1996 Henkels et al. ................. 365/189.02
6,038,193 * 3/2000 Wang et al. ..................... 365/230.05
6,215,694 * 4/2001 Li et al. ............................... 365/156

* cited by examiner

Primary Examiner—Vu A. Le
(74) Attorney, Agent, or Firm—Schwegman, Lundberg, Woessner & Kluth, P.A.

(57) ABSTRACT

A register file for use within, for example, a microprocessor or other digital processing device includes a register file cell having a pull down transistor that is driven by a static logic circuit (e.g., a NOR gate). During a read operation, the static logic circuit causes the pull down transistor to discharge a dynamic bit line node when a predetermined data value is stored within a data storage area of the register file cell. The logic circuit serves to isolate the input terminal of the pull down transistor from a potentially noisy read signal received by the register file cell, thus preventing noise induced leakage currents from being created. In one embodiment, a bias circuit is provided that applies a bias signal to the pull down transistor during non-read intervals to significantly reduce leakage currents flowing through the pull down transistor at these times.

28 Claims, 3 Drawing Sheets

PSEUDO-STATIC LEAKAGE-TOLERANT REGISTER FILE BIT-CELL CIRCUIT

FIELD OF THE INVENTION

The invention relates generally to semiconductor devices and, more particularly, to semiconductor memory devices.

BACKGROUND OF THE INVENTION

An ongoing trend in the integrated circuit (IC) industry is to continuously reduce the physical size of ICs. This reduction in size is often achieved by device scaling where each of the dimensions of a circuit are reduced by a predetermined amount to create a smaller circuit having the same or similar operating characteristics as the original circuit. Device scaling, however, has resulted in an increase in sub-threshold leakage currents within circuits using field effect transistors, particularly insulated gate field effect transistors (IGFETs) (e.g., metal-oxide-semiconductor field effect transistor (MOSFETs)). This increased leakage can have a negative impact on circuit robustness, particularly in circuits utilizing wide OR dynamic gate structures (e.g., register files). One technique for improving the robustness of such circuits is to utilize higher threshold voltage ($V_T$) transistors within the IC that are less likely to leak when the transistors are in an "off" condition. The use of high $V_T$ transistors, however, will typically cause a significant reduction in performance in an IC. As can be appreciated, such performance penalties are generally undesirable.

DETAILED DESCRIPTION

Figure 1:
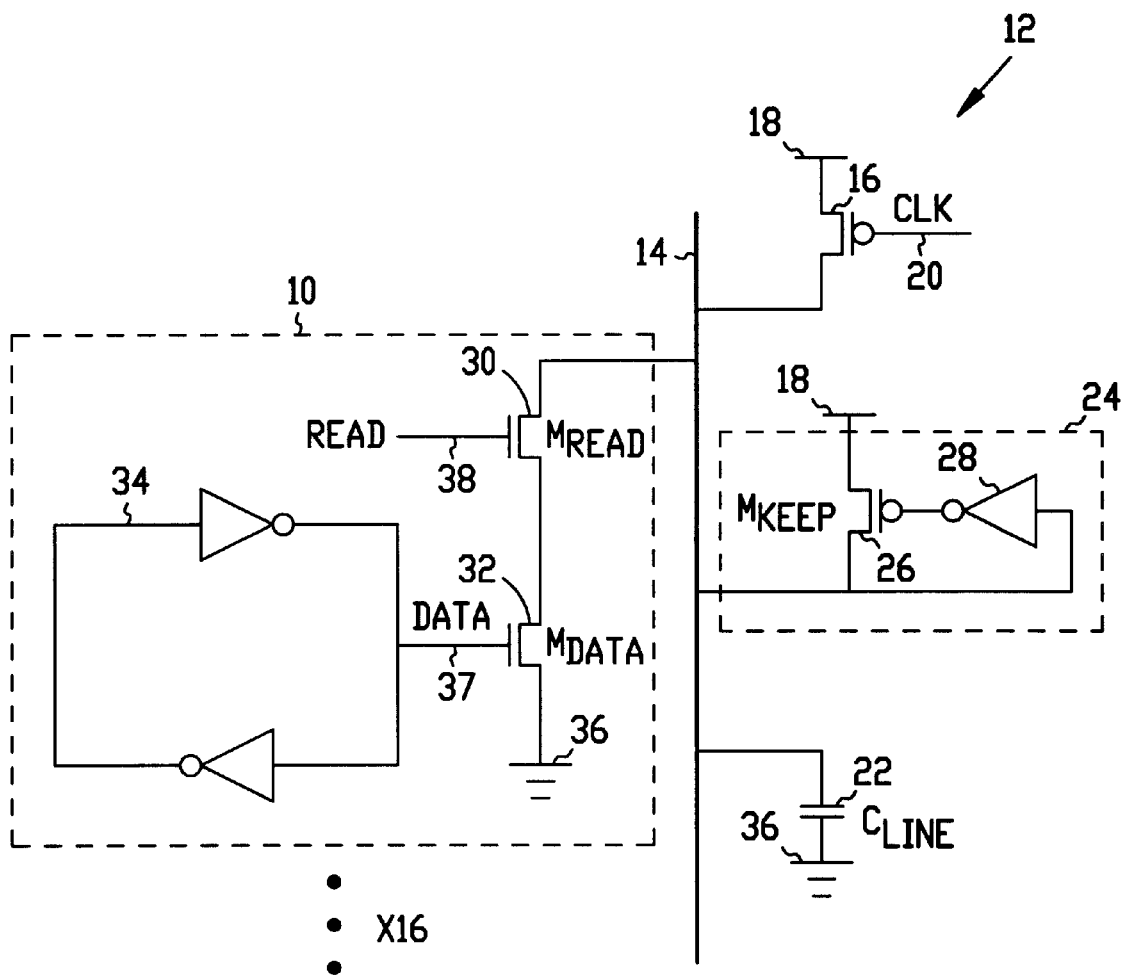
FIG. 1 is a schematic diagram illustrating a conventional register file cell.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The present invention relates to dynamic gate-based register file cell designs that are capable of highly robust operation while still maintaining a level of performance characteristic of low threshold voltage transistors. The register file cell includes a pull down transistor that is used to conditionally discharge a precharged bit line during a read operation based on a data bit value stored within a storage location of the register file cell. A static logic gate within the register file cell is used to drive the pull down transistor based on, among other things, a read signal input. Because the logic gate is interposed between the read signal and the input of the pull down transistor, noise within the read signal is less likely to generate leakage current within the pull down transistor than it would be if the read signal where directly applied to the input of the transistor. That is, the logic gate shifts the noise threshold of the register file cell from the threshold voltage of the pull down transistor to the switching threshold of the logic gate. In at least one embodiment, a bias device is provided within a register file cell to appropriately bias the pull down transistor within the cell when a read operation is not being performed for the cell to reduce leakage through the pull down transistor. In one implementation, for example, a bias device applies a negative gate to source voltage to an N-channel IGFET pull down transistor during non-read periods to reduce leakage in the register file. As will be apparent to a person of ordinary skill in the art, many other biasing arrangements can also be used. The inventive principles can be used to provide highly robust, high performance register files for use within, for example, microprocessors and other digital processing devices.

FIG. 1 is a schematic diagram illustrating a conventional register file cell 10 that operates as a data storage unit within a larger memory structure known as a register file 12. The register file 12 can be used within, for example, a microprocessor to provide temporary data storage for an arithmetic logic unit (ALU) that performs arithmetic and logic functions within the microprocessor under the control of a control unit. In a typical register file 12, each register file cell 10 is capable of storing a single bit of digital data. The register file cell 10 is coupled to a bit line 14 that operates as a data flow path between the register file 12 and external circuitry (e.g., a data bus). As illustrated, a plurality of register file cells 10 (e.g., 16 in the illustrated embodiment) are coupled to the bit line 14 of the register file 12. The register file 12 will also typically include other bit lines having the same number of register file cells 10 couple thereto. This allows multiple data bits to be written to and/or read from the register file 12 in parallel.

The register file 12 illustrated in FIG. 1 uses a "dynamic gate" approach to data retrieval from the register file cells 10. That is, the bit line 14 is precharged during a dynamic precharge period and is then conditionally discharged as part of a read operation during a subsequent dynamic evaluation period based on a data value stored within a corresponding register file cell 10. This dynamic gate approach is typically used to increase the operational speed of circuitry by decreasing the effective switching capacitance within the circuitry. As illustrated, a precharge transistor 16 is connected between the bit line 14 and a supply terminal 18 to controllably couple the bit line 14 to the supply terminal 18 in response to a clock signal 20 (CLK). In the illustrated embodiment, the precharge transistor 16 is a PMOS device. Thus, the precharge transistor 16 couples the bit line 14 to the supply terminal 18 during a low voltage portion of the clock cycle and decouples the bit line 14 from the supply terminal 18 during a high voltage portion of the clock cycle. The bit line 14 has an inherent capacitance 22 ($C_{LINE}$) to ground 36. When the bit line 14 is coupled to the supply terminal 18 by the precharge transistor 16, the bit line 14 is charged up to a predetermined voltage level (e.g., Vcc).

When the bit line 14 is de-coupled from the supply terminal 18 by the precharge transistor 16, the bit line 14 will maintain its voltage level unless charge is allowed to flow away from the bit line 14 by some mechanism (e.g., leakage current through one or more of the register file cells 10).

A charge keeper 24 is provided to maintain the voltage on the bit line 14 when a fully charged condition is desired. In the illustrated embodiment, the charge keeper 24 includes a PMOS keeper transistor 26 having an inverter 28 driving a gate terminal thereof. The keeper transistor 26 keeps the bit line 14 coupled to the supply terminal 18 when a logic high level is present on the bit line 14, regardless of the state of the precharge transistor 16. When the voltage on the bit line 14 drops to a logic low value, the keeper transistor 26 decouples the bit line 14 from the supply terminal 18.

As illustrated, each register file cell 10 includes a read transistor 30 ($M_{READ}$), a data transistor 32 ($M_{DATA}$), and a storage cell 34. The storage cell 34 is operative for storing a single digital data bit within the register file cell 10. The output portions of the read transistor 30 and the data transistor 32 are connected in series between the bit line 14 and ground 36. The input terminal 37 of the data transistor 32 is connected to the storage cell 34 to receive an indication of the data bit value stored therein. If the data bit indication has a first value (e.g., a "high" binary voltage value), the data transistor 36 is turned on and the read transistor 30 is coupled to ground 36. If the data bit indication has a second value (e.g., a "low" binary voltage value), the data transistor 36 is turned off and the read transistor 30 is isolated from ground 36.

The input terminal 38 of the read transistor 30 receives a read signal (READ) that is indicative of whether a read operation is currently being performed for the corresponding register file cell 10. The read signal will usually be a binary signal that has a first voltage level when a read operation is currently being performed for the cell 10 (i.e., a read indication) and a second voltage level when a read operation is not currently being performed for the cell 10. Typically, only a single register file cell 10 coupled to a bit line 14 will receive a read indication at a given time. When the read signal indicates that a read operation is currently being performed for a cell 10, the corresponding read transistor 30 turns on, coupling the bit line 14 to the data transistor 32. Therefore, depending upon the data bit value stored in the register file cell 10, the bit line 14 will either be shorted to ground or isolated from ground by the data transistor 32 during the read operation. As described above, this conditional discharge of the bit line 14 will take place during an evaluation period after the bit line has been precharged. A similar conditional discharge can therefore take place during each cycle of the clock signal 20. The voltage level on the bit line 14 after the conditional discharge is representative of the data bit value retrieved from the selected register file cell 10.

A problem with the register file cell arrangement of FIG. 1 is that leakage current through one or more of the read transistors 30 coupled to a bit line 14 can inadvertently discharge the bit line 14 resulting in an incorrect data value on the bit line 14 following a read operation. Typically, the leakage problem will involve multiple read transistors 30 that each draw charge from the bit line 14. For example, in one scenario, a logic high data bit is stored in most of the storage cells 34 associated with a particular bit line 14 (e.g., 14 of the 16 cells). Thus, each of the corresponding read transistors 30 are coupled to ground 36 through an associated data transistor 32 and are therefore more likely to leak. The combined current leakage through these read transistors 30 may be enough to discharge the bit line 14 prematurely. If this occurs, a subsequent read operation involving a register file cell 10 storing a logic low data bit will result in a false read. Exacerbating the problem is the fact that noise on the real signal line (e.g., coupling noise) will tend to increase the amount of leakage through the read transistors 30. To address the leakage issue, many designers have switched to higher threshold voltage ($V_T$) read transistors 30. However, as discussed above, this generally results in lower performance operation. In addition, even using high $V_T$ transistors, read noise can still generate significant amounts of leakage. Another potential fix involves increasing the size of the keeper transistor 26 (i.e., using a transistor that is capable of higher charging current) so that the voltage on the bit line 14 can be maintained in spite of the leakage. However, as with the high $V_T$ read transistors 30, this also generally results in reduced performance.

Figure 2:
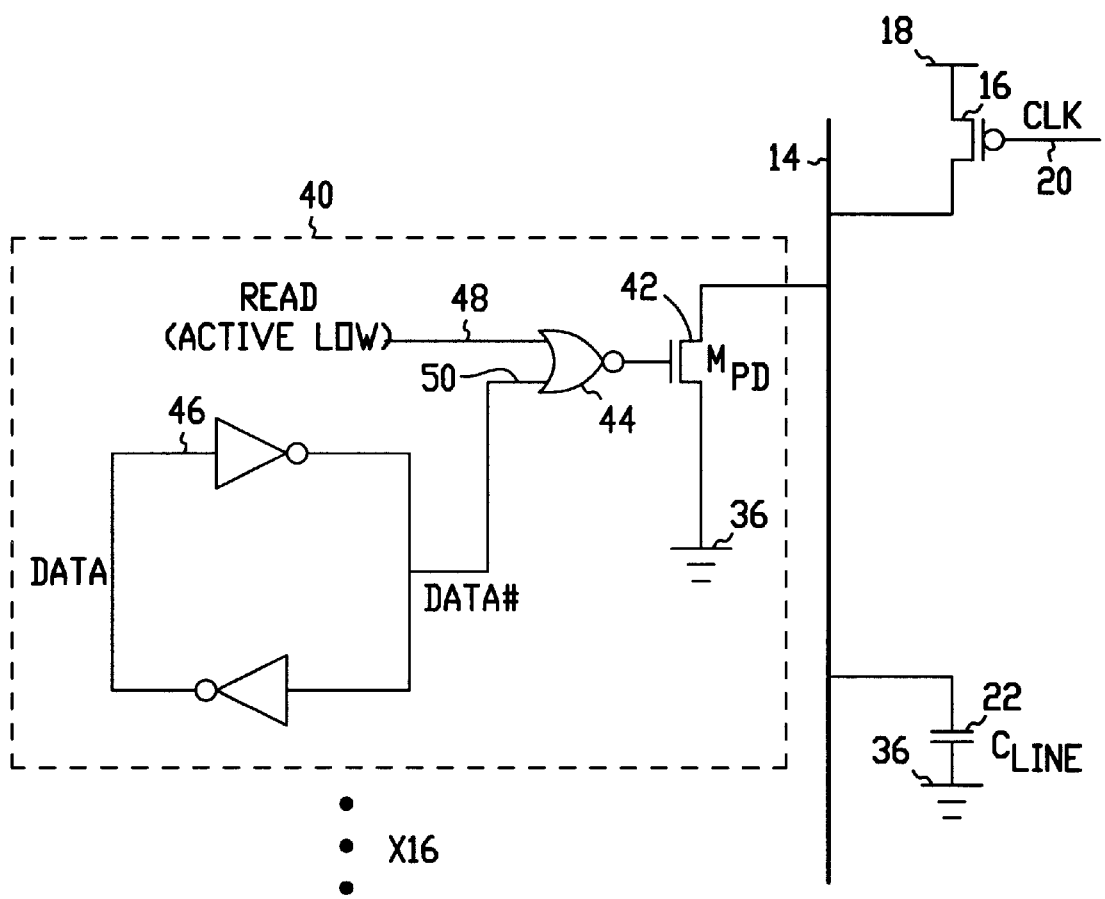
FIG. 2 is a schematic diagram illustrating a register file cell in accordance with one embodiment of the present invention.

FIG. 2 is a schematic diagram illustrating a register file cell 40 in accordance with one embodiment of the present invention. The register file cell 40 is capable of reduced leakage operation as compared to the register file cell 10 of FIG. 1. Thus, a register file utilizing the register file cell 40 of FIG. 2 is less likely to require a larger keeper transistor 26 to prevent erroneous reads. As illustrated, the register file cell 40 of FIG. 2 includes: a pull down transistor ($M_{PD}$) 42, a static logic gate 44, and a storage cell 46. The pull down transistor 42 is operative for discharging the bit line 14 to ground 36 when a predetermined control indication is received at an input terminal thereof from the logic gate 44. In the illustrated embodiment, an N-channel IGFET device is used as the pull down transistor 42 and, therefore, the predetermined control indication is a logic high value applied to the gate terminal of the pull down transistor 42. It should be appreciated that other transistor types can also be used.

In accordance with one aspect of the invention, the logic gate 44 acts to buffer the input of the pull down transistor 42 from the noise commonly associated with the read signal. That is, the logic gate 44 shifts the noise threshold of the register file cell 40 from the threshold voltage of the pull down transistor 42 to the switching threshold of the logic gate 44. The logic gate 44 includes two input terminals 48, 50. One of the input terminals 48 receives an active-low read signal (READ) and the other input terminal 50 is coupled to a complementary terminal of the storage cell 46 to receive a complement of the data bit stored therein. In the illustrated embodiment, the logic gate 44 is a NOR gate. Therefore, when the read signal is logic low (indicating that a read operation is being performed for the corresponding register file cell 10) and the stored data value is logic high, the logic gate 44 outputs a logic high value to the gate terminal of the pull down transistor 42. In response, the pull down transistor 42 discharges the bit line 42 to ground 36. On the other hand, if the stored data value is logic low when the read signal is logic low, the logic gate 44 delivers a logic low value to the gate terminal of the pull down transistor 42 and the bit line 14 is not discharged. The output of the logic gate 44 will also be logic low when the active low read signal is logic high, regardless of the data bit value stored in the storage cell 46. When the output of the logic gate 44 is logic low, the bulk of the read signal noise is not reaching the gate terminal of the pull down transistor 42 and cannot, therefore, increase the leakage current through the device. Instead, a relatively low noise, logic low output of the logic gate 44 is being applied to the gate terminal of the pull down transistor 42.

As described above, in the embodiment illustrated in FIG. 2, a NOR gate is used as the logic gate 44. As will be apparent to persons of ordinary skill in the art, however, other types of logic circuitry (including multi-gate circuits) can alternatively be used. The type of logic circuitry that is used in a particular implementation will usually depend upon the specifics of the design (e.g., the type of transistor used as the pull down transistor 42, the configuration of the storage cell 46, etc.), the goal being to isolate the pull down transistor 42 from the read noise associated with the read signal. The above-described approach is effective for reducing leakage currents generated by noise voltages on the input terminal of the pull down transistor 42. The approach will not, however, have a significant impact on the generation of leakage currents typically associated with low $V_T$ scaled devices that are not noise related. Therefore, if noise generated leakage is the main concern within a circuit, the register file cell 40 of FIG. 2 can be used with a low $V_T$ pull down device to achieve enhanced performance. If other forms of leakage are expected, it may still be desirable to utilize a high $V_T$ pull down device in the register file cell 40 of FIG. 2.

Figure 3:
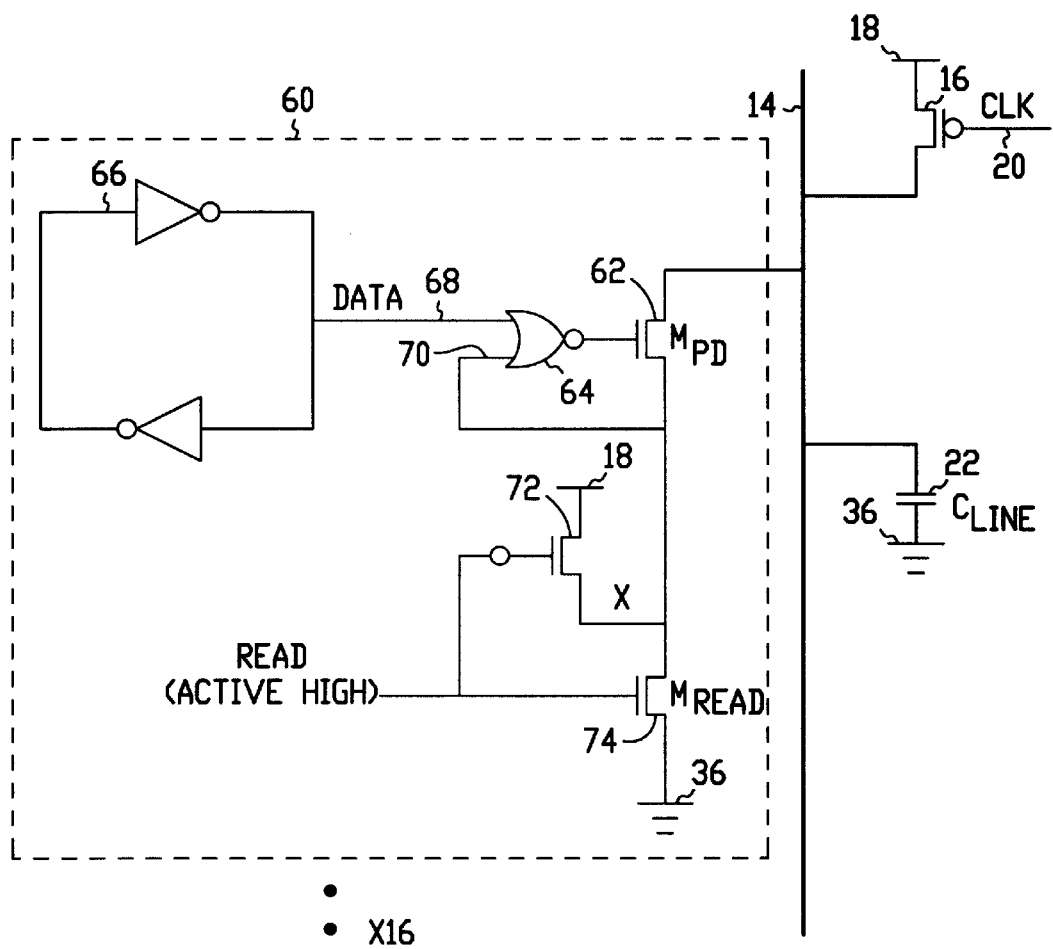
FIG. 3 is a schematic diagram illustrating a register file cell in accordance with another embodiment of the present invention.

FIG. 3 is a schematic diagram illustrating a register file cell 60 in accordance with another embodiment of the present invention. As illustrated, the register file cell 60 includes: a pull down transistor 62 ($M_{PD}$), a logic gate 64, a storage cell 66, a bias device 72, and a read transistor 74 ($M_{READ}$). As with the cell 40 of FIG. 2, the logic gate 64 of the register file cell 60 provides isolation between a possibly noisy read signal and the input terminal of the pull down transistor 62. The bias device 72 is operative for applying a bias voltage to the pull down transistor 62 during appropriate periods that significantly reduces the level of current leakage through the device during those periods. Thus, the register file cell 60 of FIG. 3 can be implemented using low $V_T$ transistor devices to achieve high performance operation while still maintaining high robustness.

With reference to FIG. 3, the pull down transistor 62 and the read transistor 74 each include an input terminal and first and second output terminals. The first output terminal of the pull down transistor 62 is connected to the bit line 14. The second output terminal of the pull down transistor 62 is connected to the first output terminal of the read transistor 74. The second output terminal of the read transistor 74 is connected to ground 36. The logic gate 64 drives the input terminal of the pull down transistor 62. The logic gate 64 has first and second inputs 68, 70. The first input 68 is coupled to the storage cell 66 to receive the data bit value stored therein. The second input 70 is coupled to the second output terminal of the pull down transistor 62. The input terminal of the read transistor 74 receives an active high read signal (i.e., the read indication is a logic high voltage). When the read signal is logic high, the read transistor 74 couples the second output terminal of the pull down transistor 62 to ground 36. Therefore, a logic low voltage is present at the second input 70 of the logic gate 64. In the illustrated embodiment, the logic gate 64 is a NOR gate. Therefore, during a read operation, the output of the logic gate 64 will be logic high when the digital data bit stored within the storage cell 66 is logic low. When this occurs, the pull down transistor 62 is turned on and the bit line 14 is discharged to ground 36 through the read transistor 74. When the digital data bit stored within the storage cell 66 is logic high, the output of the logic gate 64 will be low and the pull down transistor 62 will remain off.

As described previously, the bias device 72 biases the pull down transistor 62 during appropriate periods in a manner that reduces the level of current leakage through the pull down transistor 62. The bias device 72 has an input terminal and first and second output terminals. In the illustrated embodiment, the bias device 72 is a P-channel IGFET transistor and, therefore, the input terminal is a gate terminal and the first and second output terminals are each source/drain terminals. As illustrated, the first output terminal of the bias device 72 is coupled to supply terminal 18. The second output terminal of the bias device 72 is connected to the second output terminal of the pull down transistor 62. The input terminal of the bias device 72 receives the active high read signal. When the read signal is logic high (i.e., a read operation is being performed for the cell 60), the bias device 72 is off and has substantially no effect on the circuit. When the read signal is logic low (i.e., a read operation is not being performed for the cell 60), the bias device 72 couples the supply terminal 18 to the second output terminal of the pull down transistor 62. This places a logic high voltage on the second input 70 of the logic gate 64, which forces the output of the logic gate to a logic low value. Therefore, a negative voltage exists from the input terminal of the pull down transistor 62 to the second output terminal of the pull down transistor 62. In the illustrated embodiment, the pull down transistor 62 is an N-channel IGFET device. Therefore, as is well known, the negative voltage from the input terminal (i.e., the gate terminal) of the pull down transistor 62 to the second output terminal (i.e., the source terminal) of the pull down transistor 62 will reduce the leakage current through the pull down transistor 62 to negligible levels. When the read signal again switches to a logic high value, the bias voltage is removed from the pull down transistor 62 and a read operation is permitted to take place.

As described above, in the illustrated embodiment, a P-channel IGFET transistor is used as the bias device 72. As will be apparent to persons of ordinary skill in the art, many alternative bias devices/circuits can be used to provide a leakage reducing bias signal in accordance with the principles of the present invention. The type of device or circuit that is used in a particular implementation will usually depend upon, among other things, the type of pull down transistor 62 being used, the type of read transistor 36 being used, the type of read signal (e.g., active high or active low), as well as other design considerations. The goal of the bias device/circuit is to reduce leakage through the pull down transistor 62 during some or all of the non-read period associated with the register file cell.

Although the present invention has been described in conjunction with certain embodiments, it is to be understood that modifications and variations may be resorted to without departing from the spirit and scope of the invention as those skilled in the art readily understand. Such modifications and variations are considered to be within the purview and scope of the invention and the appended claims.

What is claimed is:

1. A register file comprising:
   a bit line; and
   a register file cell including:
      a storage cell to store a digital data bit;
      a first transistor coupled to said bit line; and
      a logic circuit to drive an input terminal of said first transistor, said logic circuit to apply a control indication to said input terminal of said first transistor during a read operation when said storage cell includes a digital data bit having a first value, said first transistor to couple said bit line to a ground node in response to said control indication.

2. The register file claimed in claim 1, comprising:
   a switch to precharge said bit line during a dynamic precharge period, said first transistor to discharge said bit line to ground during a dynamic evaluation period occurring after said dynamic precharge period when said first transistor receives said control indication.

3. The register file claimed in claim 1, wherein:
said logic circuit includes a NOR gate.

4. The register file claimed in claim 1, wherein:
said logic circuit includes first and second input terminals, said first input terminal to receive a value related to the digital data bit stored within said storage cell.

5. The register file claimed in claim 4, wherein:
said second input terminal of said logic circuit receives a read indication when a read operation is being performed.

6. The register file claimed in claim 4, wherein:
said first transistor includes first and second output terminals, said first output terminal of said first transistor being connected to said bit line, said second output terminal of said first transistor being connected to said second input terminal of said logic circuit.

7. The register file claimed in claim 1, wherein:
said register file cell includes a second transistor to couple an output terminal of said first transistor to said ground node when a read operation is being performed.

8. The register file claimed in claim 1, wherein:
said register file cell includes a bias circuit coupled to said first transistor to apply a bias voltage to said first transistor when a read operation is not being performed, said bias voltage to reduce a leakage current through said first transistor.

9. The register file claimed in claim 8, wherein:
said bias circuit applies said bias voltage between said input terminal of said first transistor and an output terminal of said first transistor.

10. The register file claimed in claim 9, wherein:
said first transistor is an insulated gate field effect transistor (IGFET) having a gate terminal, a source terminal, and a drain terminal, wherein said bias circuit applies said bias voltage between said gate terminal and said source terminal of said first transistor.

11. The register file claimed in claim 10, wherein:
said first transistor is an N-channel device and said bias voltage is a negative voltage.

12. The register file claimed in claim 8, wherein:
said bias circuit includes a second transistor having an input terminal to receive a read indication when a read operation is being performed, said second transistor to couple said output terminal of said first transistor to a voltage supply node when said read operation is not being performed.

13. A digital processing device comprising:
a register file to temporarily store digital data within said digital processing device, said register file including:
a bit line; and
a register file cell including:
a storage cell to store a digital data bit;
a first transistor coupled to said bit line; and
a logic circuit to drive an input terminal of said first transistor, said logic circuit to apply a control indication to said input terminal of said first transistor during a read operation when said storage cell includes a digital data bit having a first value, said first transistor to couple said bit line to a ground node in response to said control indication; and
a control unit coupled to said register file, said control unit to deliver instructions to said register file during operation of said digital processing device instructing said register file to perform data storage and retrieval functions.

14. The digital processing device claimed in claim 13, comprising:
an arithmetic logic unit (ALU) coupled to said register file and said control unit, said ALU to perform arithmetic and logic operations on data retrieved from said register file based on commands received from said control unit.

15. The digital processing device claimed in claim 13, wherein:
said register file includes a plurality of register file cells that each include:
a storage cell to store a digital data bit;
a first transistor coupled to said bit line; and
a logic circuit to drive an input terminal of said first transistor, said logic circuit to apply a control indication to said input terminal of said first transistor during a read operation when said storage cell includes a digital data bit having a first value, said first transistor to couple said bit line to a ground node in response to said control indication.

16. The digital processing device claimed in claim 13, wherein:
said digital processing device is a microprocessor.

17. A register file comprising:
a bit line; and
a register file cell including:
a storage cell to store a digital data bit;
a first transistor connected to said bit line, said first transistor to couple said bit line to a ground node when said first transistor is turned on; and
a logic circuit to drive an input terminal of said first transistor, said logic circuit having a first input to receive a read signal indicative of a current read status of said register file cell and a second input to receive a value related to the digital data bit stored within said storage cell, said logic circuit to turn on said first transistor during a read operation when said digital data bit stored within said storage cell has a first value.

18. The register file claimed in claim 17, wherein said logic circuit includes a NOR gate.

19. The register file claimed in claim 17, wherein:
said second input of said logic circuit receives a complement of said digital data bit stored within said storage cell.

20. The register file claimed in claim 17, wherein:
said read signal has a first voltage value during a read operation involving said register file cell and a second voltage value when a read operation is not being performed for said register file cell.

21. The register file claimed in claim 17, wherein:
said first transistor includes first and second output terminals, said first output terminal being connected to said bit line and said second output terminal being connected to said ground node, wherein said first transistor is turned on by applying a voltage to said input terminal of said first transistor that exceeds a threshold voltage thereof.

22. A register file comprising:
a bit line; and
a register file cell including:
a storage cell to store a digital data bit;

a first transistor connected to said bit line;

a logic circuit to drive an input terminal of said first transistor, said logic circuit to turn on said first transistor when said digital data bit stored in said storage cell has a first value during a read operation; and a bias circuit coupled to said first transistor to apply a bias voltage to said first transistor when a read operation is not being performed to reduce current leakage through said first transistor from said bit line.

23. The register file claimed in claim 22, wherein:

said bias circuit applies said bias voltage between an input terminal of said first transistor and an output terminal of said first transistor.

24. The register file claimed in claim 22, wherein:

said first transistor includes first and second output terminals, said first output terminal of said first transistor being connected to said bit line; and said bias circuit includes a second transistor having an input terminal to receive a read signal indicative of a current read status of said register file, said second transistor to couple said second output terminal of said first transistor to a voltage supply node when said read signal indicates that a read operation is not being performed.

25. The register file claimed in claim 24, wherein:

said register file cell comprises a third transistor having an input terminal to receive said read signal, said third transistor to couple said second output terminal of said first transistor to said ground node when said read signal indicates that a read operation is being performed.

26. The register file claimed in claim 25, wherein:

said second transistor is a PMOS device and said third transistor is an NMOS device.

27. The register file claimed in claim 22, wherein:

said logic circuit includes a NOR gate.

28. The register file claimed in claim 22, wherein:

said bias circuit includes a single transistor.

* * * * *